US010431740B2

(12) United States Patent
Cain et al.

(10) Patent No.: US 10,431,740 B2
(45) Date of Patent: Oct. 1, 2019

(54) CONTINUOUS, SCALABLE DEPOSITION OF ALIGNED CARBON NANOTUBES USING SPRAYS OF CARBON NANOTUBE SOLUTIONS

(71) Applicant: Carbonics Inc., Marina del Rey, CA (US)

(72) Inventors: Tyler Andrew Cain, Marina del Rey, CA (US); Christopher Michael Rutherglen, Marina del Rey, CA (US); Alexander Allen Kane, Marina del Rey, CA (US); Philbert Francis Marsh, Marina del Rey, CA (US); Kosmas Galatsis, Marina del Rey, CA (US)

(73) Assignee: Carbonics Inc., Marina del Rey, CA (US)

( * ) Notice: Subject to any disclaimer, the term of this patent is extended or adjusted under 35 U.S.C. 154(b) by 311 days.

(21) Appl. No.: 15/409,897

(22) Filed: Jan. 19, 2017

(65) Prior Publication Data

US 2017/0213963 A1  Jul. 27, 2017

Related U.S. Application Data

(60) Provisional application No. 62/286,274, filed on Jan. 22, 2016.

(51) Int. Cl.
*B05D 1/06* (2006.01)
*H01L 51/00* (2006.01)
(Continued)

(52) U.S. Cl.
CPC ............ *H01L 51/0003* (2013.01); *B05D 1/06* (2013.01); *H01L 51/0048* (2013.01);
(Continued)

(58) Field of Classification Search
CPC ... B05D 1/06; B05D 1/18; B05D 1/22; B05D 5/12; B01J 8/20; H01L 51/0045; H01L 51/0048; H01L 51/0558
(Continued)

(56) References Cited

U.S. PATENT DOCUMENTS 8,455,055 B1 *  6/2013  Humfeld ................. B05D 1/18
                                                  427/331
8,940,562 B1 *  1/2015  Li ....................... H01L 51/0004
                                                  257/E21.499

(Continued)

OTHER PUBLICATIONS

Joo et al. "Dose-controlled, Floating Evaporative ZSelf-assembly and Alignment of Semiconducting Carbon Nanotubes from Orgnaic Solvents" LangMuir 2014, pp. 3460-3466—no month available.*
(Continued)

*Primary Examiner* — Brian K Talbot (57) ABSTRACT

A system for producing a layer of aligned carbon nanotubes, the system comprising: a sprayer, a solution delivery tube configured to deliver a carbon nanotube solution to the sprayer, and a reservoir configured to contain a subphase. The sprayer is configured to generate a continuous spray of the carbon nanotube solution. The continuous floating layer is supported by the subphase. The spray of carbon nanotube solution includes droplets of the carbon nanotube solution, the droplets having a median diameter in a range from about 1 to about 100 microns. The sprayer maintains the continuous floating layer of carbon nanotube solution on the subphase as a substrate is inserted into or removed from the subphase, the carbon nanotube solution being in contact with the substrate.

12 Claims, 10 Drawing Sheets

(51) Int. Cl.
| | |
|---|---|
| *H01L 51/05* | (2006.01) |
| *B05D 5/12* | (2006.01) |
| *B05D 1/18* | (2006.01) |
| *B05D 1/22* | (2006.01) |
| *B01J 8/20* | (2006.01) |

(52) U.S. Cl.
CPC .......... *H01L 51/0558* (2013.01); *B01J 8/20* (2013.01); *B05D 1/18* (2013.01); *B05D 1/22* (2013.01); *B05D 5/12* (2013.01)

(58) Field of Classification Search
USPC .................................................. 427/58, 122
See application file for complete search history.

(56) References Cited

U.S. PATENT DOCUMENTS

| | | | | |
|---|---|---|---|---|
| 9,368,723 | B2* | 6/2016 | Arnold | H01L 51/0003 |
| 9,425,405 | B1* | 8/2016 | Arnold | H01L 51/0007 |
| 9,673,399 | B2* | 6/2017 | Arnold | H01L 51/0007 |
| 9,786,853 | B2* | 10/2017 | Arnold | H01L 51/0558 |
| 10,037,831 | B2* | 7/2018 | Garting | B82Y 10/00 |
| 10,074,819 | B2* | 9/2018 | Arnold | H01L 51/0558 |
| 2003/0180472 | A1* | 9/2003 | Zhou | B05D 1/18 |
| | | | | 427/430.1 |
| 2006/0134326 | A1* | 6/2006 | Watanabe | B05D 1/20 |
| | | | | 427/180 |
| 2006/0257556 | A1* | 11/2006 | Dai | B82Y 30/00 |
| | | | | 427/122 |
| 2007/0144431 | A1* | 6/2007 | Lin | B82Y 10/00 |
| | | | | 118/313 |
| 2008/0182013 | A1* | 7/2008 | Reeves | B05D 1/18 |
| | | | | 427/118 |
| 2010/0084007 | A1* | 4/2010 | Jo | B82Y 10/00 |
| | | | | 136/252 |
| 2010/0233360 | A1* | 9/2010 | Lee | B82Y 10/00 |
| | | | | 427/99.5 |
| 2010/0247381 | A1* | 9/2010 | Yodh | B82Y 10/00 |
| | | | | 422/68.1 |
| 2013/0122214 | A1* | 5/2013 | Humfeld | B05D 1/18 |
| | | | | 427/551 |

OTHER PUBLICATIONS

Joo, et al.; Dose-Controlled, Floating Evaporative Self-Assembly and Alignment of Semiconducting Carbon Nanotubes from Organic Solvents; Department of Materials Science and Engineering, University of Wisconsin; 2014; 14 pgs.

Brady, et al.; Polyfluorene-Sorted, Carbon Nanotube Array Field-Effect Transistors with Increased Current Density and High On/Off Ratio; Department of Materials Science and Engineering and Department of Electrical and Computer Engineering, University of Wisconsin; Aug. 2014; 20 pgs.

Brady, et al.; Quasi-Ballistic Carbon Nanotube Array Transistors with Current Density Exceeding Si and GaAs; Research Article, Physical Science; Sep. 2016; 29 pgs.

* cited by examiner

CONTINUOUS, SCALABLE DEPOSITION OF ALIGNED CARBON NANOTUBES USING SPRAYS OF CARBON NANOTUBE SOLUTIONS

CROSS-REFERENCE TO RELATED APPLICATION

This application claims the benefit of U.S. Provisional Application Ser. No. 62/286,274 filed on Jan. 22, 2016, entitled, Continuous, Scalable Deposition of Aligned Carbon Nanotubes Using Sprays of Carbon Nanotubes Solutions, to Cain et al., which is incorporated herein by reference herein in its entirety.

TECHNICAL FIELD

This application is directed, in general, to field effect transistors, and more specifically, systems and methods of manufacturing field effect transistors with carbon nanotube channel regions.

BACKGROUND

Carbon nanotubes can be used in various electronic devices. A field effect transistor (FET) can have an active channel region that includes nanomaterials such as carbon nanotubes (CNT), single-walled carbon nanotubes (SW-CNT), and graphene. Such nanomaterials can have unique properties such as high saturation velocity, large current density, low intrinsic capacitance, large mean-free paths, theoretically high linearity, and immunity to short-channel effects due to their small size.

SUMMARY

One embodiment is a system for producing a layer of aligned carbon nanotubes, the system including a sprayer, a solution delivery tube configured to deliver a carbon nanotube solution to the sprayer, and a reservoir configured to contain a subphase. The sprayer is configured to generate a continuous spray of the carbon nanotube solution. The continuous floating layer is supported by the subphase. The spray of carbon nanotube solution includes droplets of the carbon nanotube solution, the droplets having a median diameter in a range from about 1 to about 100 microns. The sprayer maintains the continuous floating layer of carbon nanotube solution on the subphase as a substrate is inserted into or removed from the subphase, the carbon nanotube solution being in contact with the substrate.

Some embodiments of the system can further include an actuator configured to move the substrate to insert or remove the substrate into or from the subphase, respectively, as sprayer maintains a continuous floating layer of the carbon nanotube solution on the subphase. Some embodiments of the system can further include a lift table supporting the reservoir and configured to move the reservoir to insert or remove the substrate into or from the subphase, respectively, as the sprayer maintains a continuous floating layer of the carbon nanotube solution on the subphase. Some embodiments of the system can further include a pump fluidly connected to the reservoir, the pump configured to add or remove the subphase from the reservoir to insert or remove the substrate into or from the subphase, respectively, as the sprayer maintains a continuous floating layer of the carbon nanotube solution on the subphase.

Embodiments of the system can include one or more of the following features. An outlet of the sprayer can be positioned a distance from the substrate in a range from about 1 to about 20 mm. The sprayer can include an ultrasonic atomizer. The sprayer can include an electro-sprayer. The sprayer can include a nozzle through which high pressure compressed air passes to form an aerosol of the carbon nanotube solution. An outlet of the sprayer can be positioned a distance in a range from about 1 to about 50 mm of the subphase. The sprayer can be configured to provide the floating layer having a thickness in a range from about 0.01 to about 1 mm, and an area on the subphase in a range from about 500 $mm^2$ to about 71,000 $mm^2$. The system can further include a plurality of microspray dispensing nozzles configured and arranged to increase an area of the floating layer on the subphase. The reservoir can have dimensions that allow the substrate to be fully submerged in the subphase.

Another embodiment is a method of depositing a layer of aligned carbon nanotubes on a substrate, the method including providing a reservoir having a subphase contained therein. The method includes generating a continuous spray of a carbon nanotube solution from a sprayer to form a continuous floating layer of the carbon nanotube solution supported on the subphase. The spray of the carbon nanotube solution includes droplets of the carbon nanotube solution, the droplets having a median diameter in a range from about 1 to about 100 microns. The method includes removing or inserting a substrate from or into, respectively, the subphase, the continuous floating layer of the carbon nanotube solution being in contact with the substrate. The sprayer maintains the continuous floating layer of carbon nanotube solution on the subphase as the substrate is inserted into or removed from the subphase to thereby form a layer of aligned carbon nanotubes on the substrate.

In some embodiments, removing or inserting the substrate from or into the subphase includes moving an actuator holding the substrate so that the substrate is inserted into or removed from the subphase, respectively, as the sprayer maintains a continuous floating layer of the carbon nanotube solution on the subphase. In some embodiments, removing or inserting the substrate from or into the subphase includes moving a lift table supporting the reservoir so that the substrate is inserted into or removed from the subphase, respectively, as the sprayer maintains a continuous floating layer of the carbon nanotube solution on the subphase. In some embodiments removing or inserting the substrate from or into the subphase includes pumping the subphase into or out of the reservoir, via a pump fluidly connected to the reservoir, so that the substrate is inserted into or removed from the subphase, respectively, as the sprayer maintains a continuous floating layer of the carbon nanotube solution on the subphase.

Embodiments of the method can include one or more of the following features. The sprayer can include an ultrasonic atomizer. The sprayer can include an electro-sprayer. Generating the continuous spray of a carbon nanotube solution can include passing the carbon nanotube solution through a nozzle along with high pressure compressed air to form an aerosol of the carbon nanotube solution. The method can include controlling a dose of the carbon nanotubes by varying the rate at which the sprayer sprays the carbon nanotube solution or by varying a concentration of the carbon nanotube solution. The method can further include rolling up the substrate on which the layer of aligned carbon nanotubes is deposited. The deposited layer of aligned carbon nanotubes can cover an area of the substrate in a range from about 90 percent to about 100 percent of a total area of the substrate.

Another embodiment is a substrate having a layer of aligned carbon nanotubes deposited using any embodiments of the method. A density of the carbon nanotubes can be in a range from about 5 to about 300 nanotubes per micron of a lateral length perpendicular to a long axis of the aligned carbon nanotubes on the substrate and a width of the layer of aligned carbon nanotubes can be in a range from about 10 to about 300 mm. In some such embodiments a long axis of each of the carbon nanotubes are aligned within an angle of about ±20° of adjacent ones of the carbon nanotubes.

BRIEF DESCRIPTION

The embodiments of the disclosure are best understood from the following detailed description, when read with the accompanying FIGUREs. Some features in the figures may be described as, for example, "top," "bottom," "vertical" or "lateral" for convenience in referring to those features. Such descriptions do not limit the orientation of such features with respect to the natural horizon or gravity. Various features may not be drawn to scale and may be arbitrarily increased or reduced in size for clarity of discussion. Reference is now made to the following descriptions taken in conjunction with the accompanying drawings, in which.

DETAILED DESCRIPTION

Embodiments of the present disclosure benefit from the recognition that aligned CNTs for use in electronic devices and circuits can offer various advantages. For example, aligning CNTs can help CNTs form a direct path between contacts (e.g., the source and drain electrodes), which in turn helps in achieving efficient electron transport. CNTs that are of semiconducting nature can be applied to FET devices. The efficient transfer of electrons from source to drain contacts in FET devices helps to achieve better performance.

For conducting CNTs, used in, e.g., interconnects, transparent conducting films, interdigitated structures, sensors, actuators and antennae, efficient electron transport in metallic paths is desired.

Aligned anisotropic orientation of CNTs can provide improved mechanical and thermal properties for possible mechanical and thermal applications.

The methods and systems disclosed herein are compatible with standard semiconductor and standard complementary metal-oxide-semiconductor (CMOS) processes, and are applicable to the semiconductor industry.

The methods and systems disclosed herein allow aligned CNTs to be coated on substrates (e.g., wafers) with coverage close to and/or up to 100%. The density of the aligned CNTs deposited is high and substantially even across the substrates and without visible stripes. The methods and systems described herein can be readily scaled-up for producing aligned CNTs over an entire substrate/wafer, and not be limited to depositing over a rectangular area, or widths of aligned CNTs that are limited to less than one inch. The diameter of typical substrate wafers is 2-18 inches.

Figure 4:
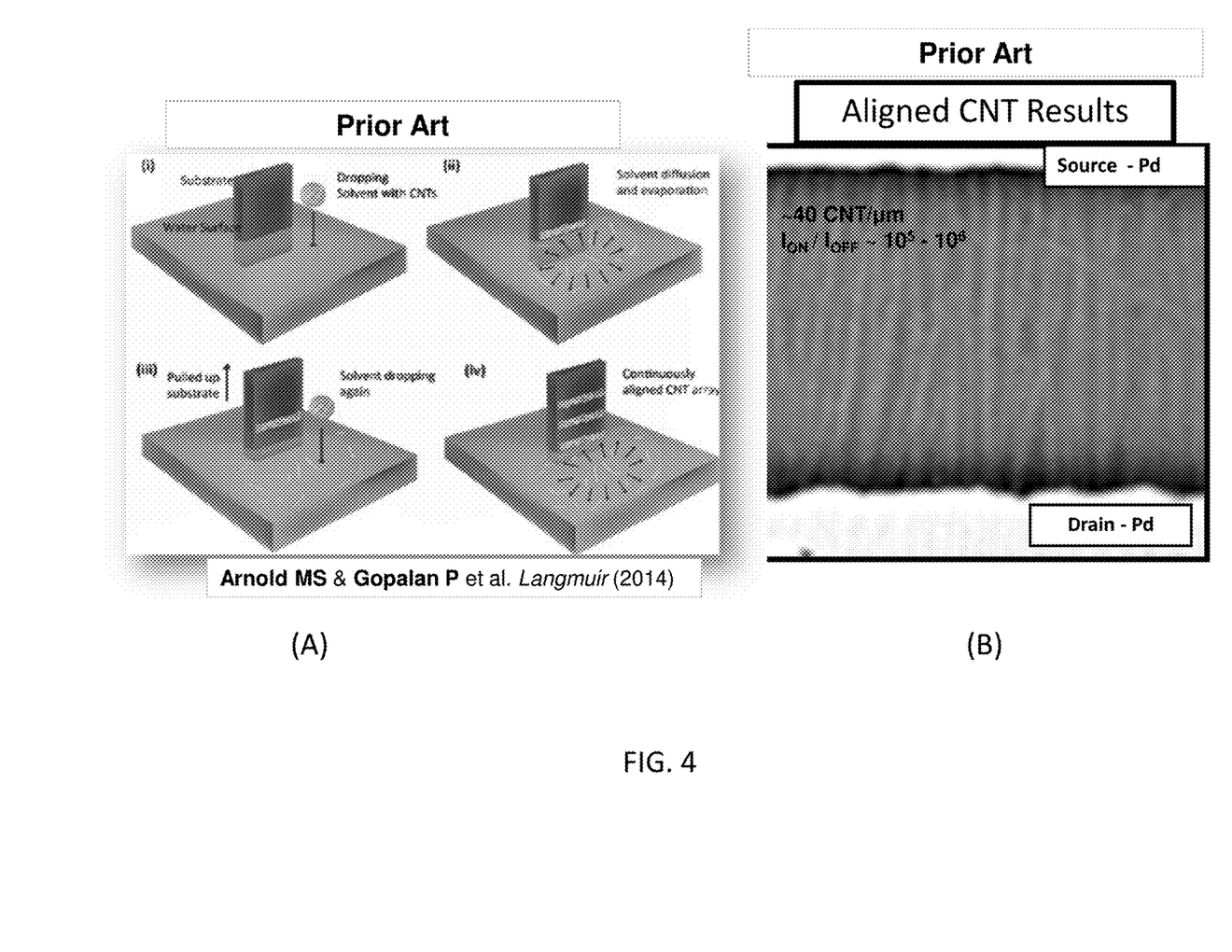
FIG. 4 shows: (A) a prior art method of forming a layer of aligned CNT, and (B) an image of aligned CNT forming using the prior art method.
Figure 5:
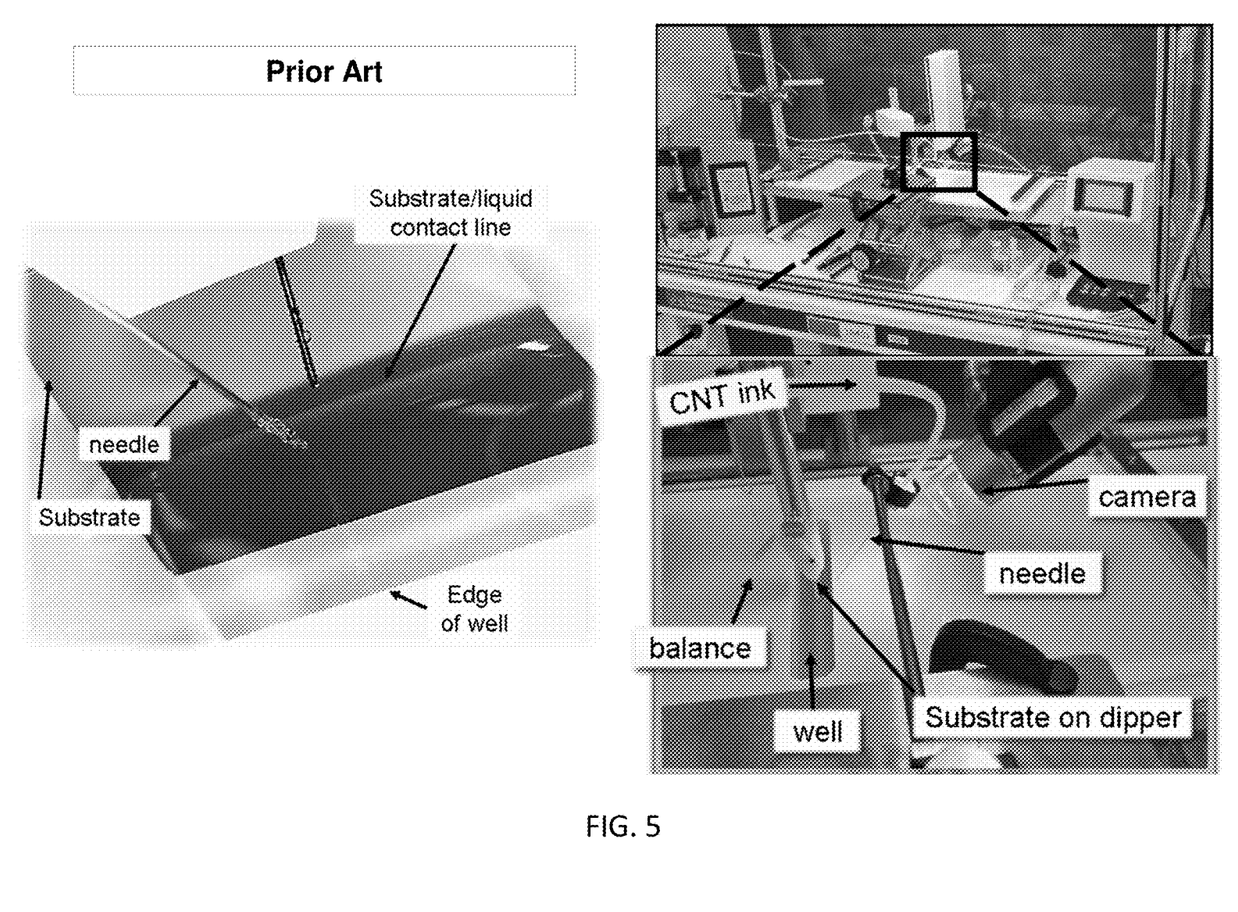
FIG. 5 shows a prior art system for depositing aligned CNT.
Figure 6:
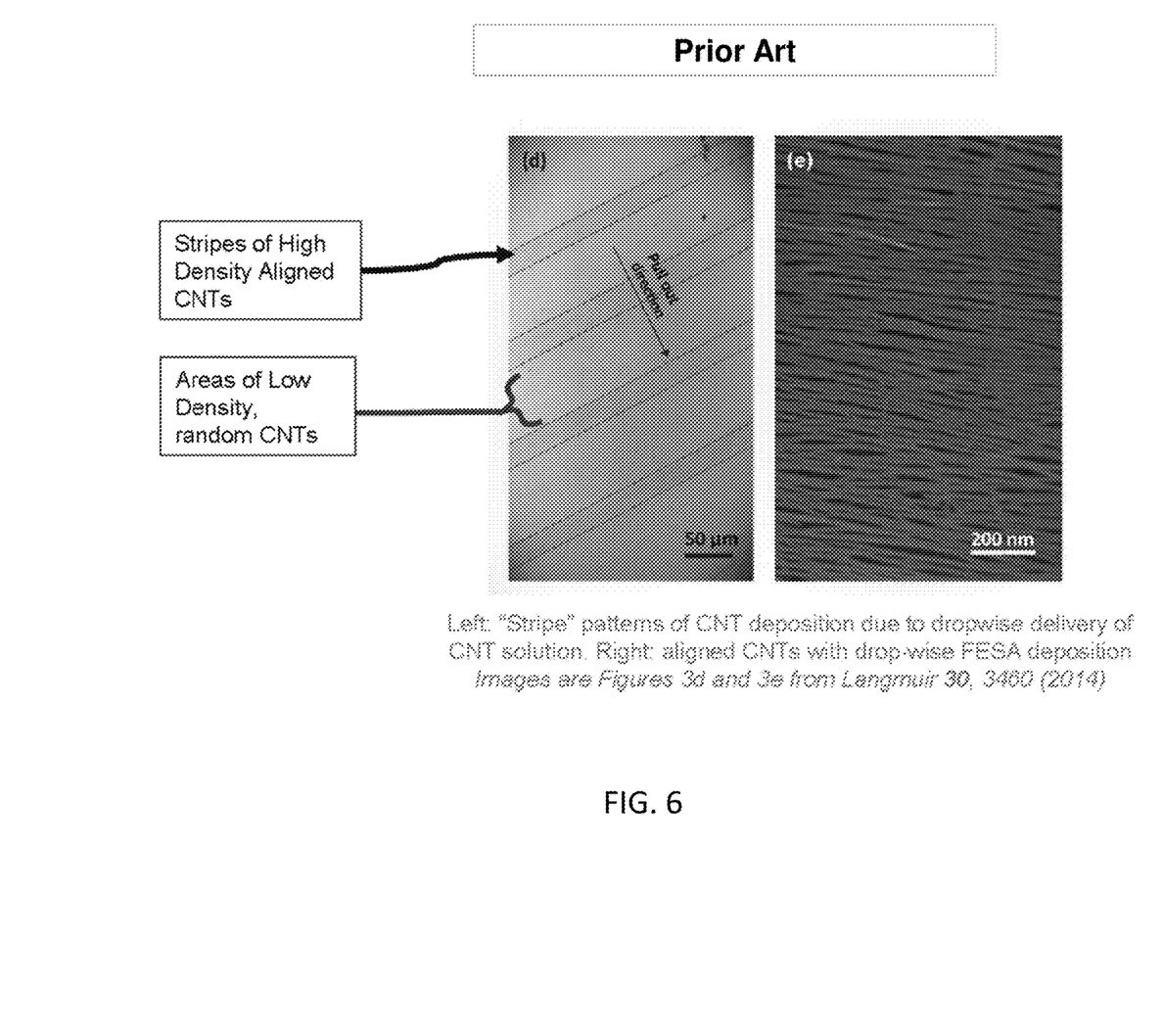
FIG. 6 shows images of CNTs formed using a prior art method.
Figure 7:
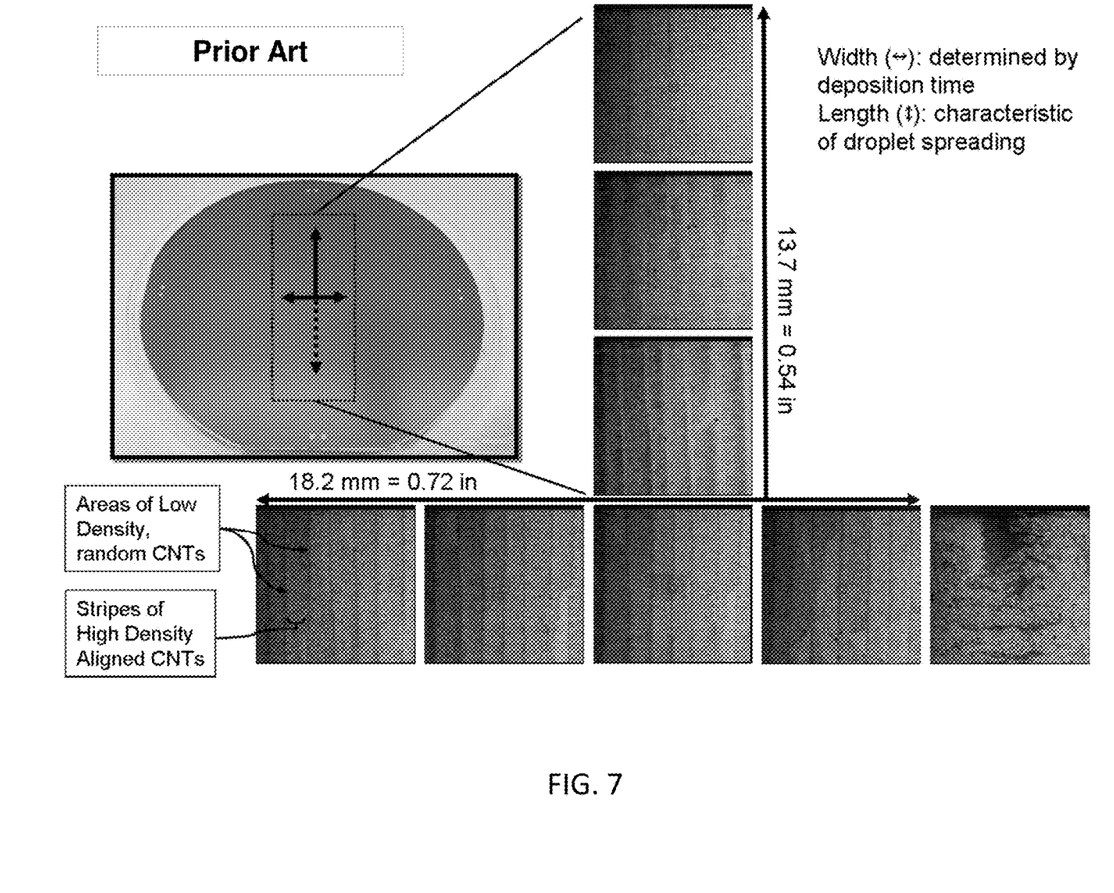
FIG. 7 shows images of CNTs formed using a prior art method.
Figure 8:
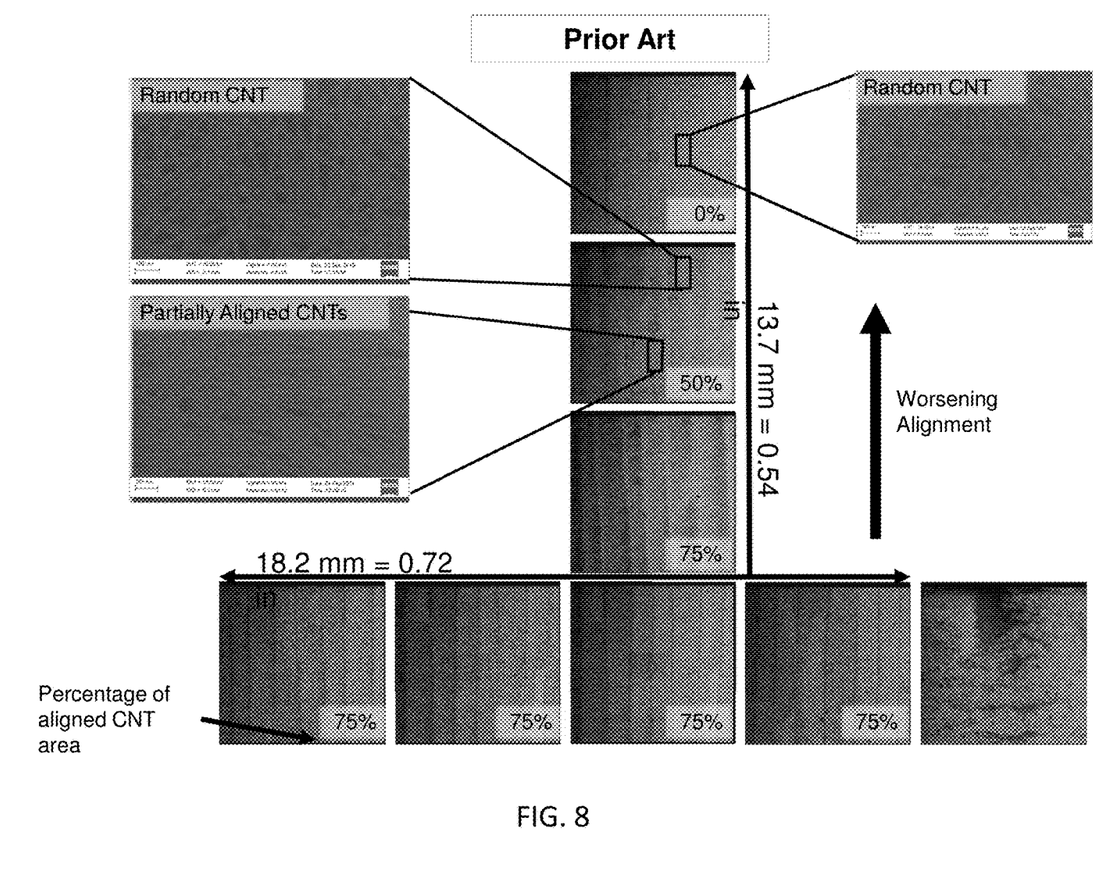
FIG. 8 shows images of CNTs formed using a prior art method.

A prior art method of dose-controlled, floating evaporative self-assembly (DCFEA), such as shown in FIGS. 4A and 4B, can produce well-aligned carbon nanotubes on a substrate. In some embodiments of the DCEFA method, a substrate can be first partially submerged in a subphase. A liquid solution containing dispersed CNT is dispensed drop-by-drop into the subphase. The liquid solution extends as a thin layer on the surface of the subphase at an air-liquid interface. Based on one interpretation, CNTs in the liquid solution contact the substrate and are deposited as a stripe of aligned CNTs at the CNT solution/subphase interface when the substrate is removed from the subphase. The stripe can fill the width of the substrate.

The DCFEA method delivers CNT solutions using a small diameter needle placed just above the subphase where drops of the CNT solution fall from the needle onto the subphase. The intermittent nature of the drop-wise addition of CNT solution can cause the related disruption of the CNT alignment on the substrate. For the DCFEA method, the length of the deposited CNT layer is determined by deposition time and substrate velocity, and the width of the deposited CNT layer is determined by characteristics of droplet spreading.

In contrast, the methods and system disclosed herein avoid the formation of stripes and areas of alternating high density, well-aligned CNT and low density, randomly oriented CNT on the substrate. We have discovered that the use of a sprayer capable of generating a continuous spray of a carbon nanotube solution, e.g., as micron sized droplets, can mitigate or eliminate altogether the formation of such alternating stripes of aligned CNT and randomly oriented CNT layers such as found using the DCFEA method.

It is not obvious that such a continuous spray would have an advantage over the drop-wise addition of CNT solution from a needle at least because the former increases the risk that the spray of micron-sized droplets of a CNT solution being directly depositing on the substrate, which we have observed to not form a layer of aligned CNTs. There is also a risk that such a continuous spray would not also disrupt the subphase, or at least, it is not obvious that such a disruption could not occur. As disclosed herein, these risks are mitigated by adjusting the spray deposition parameters used by the system.

Figure 1:
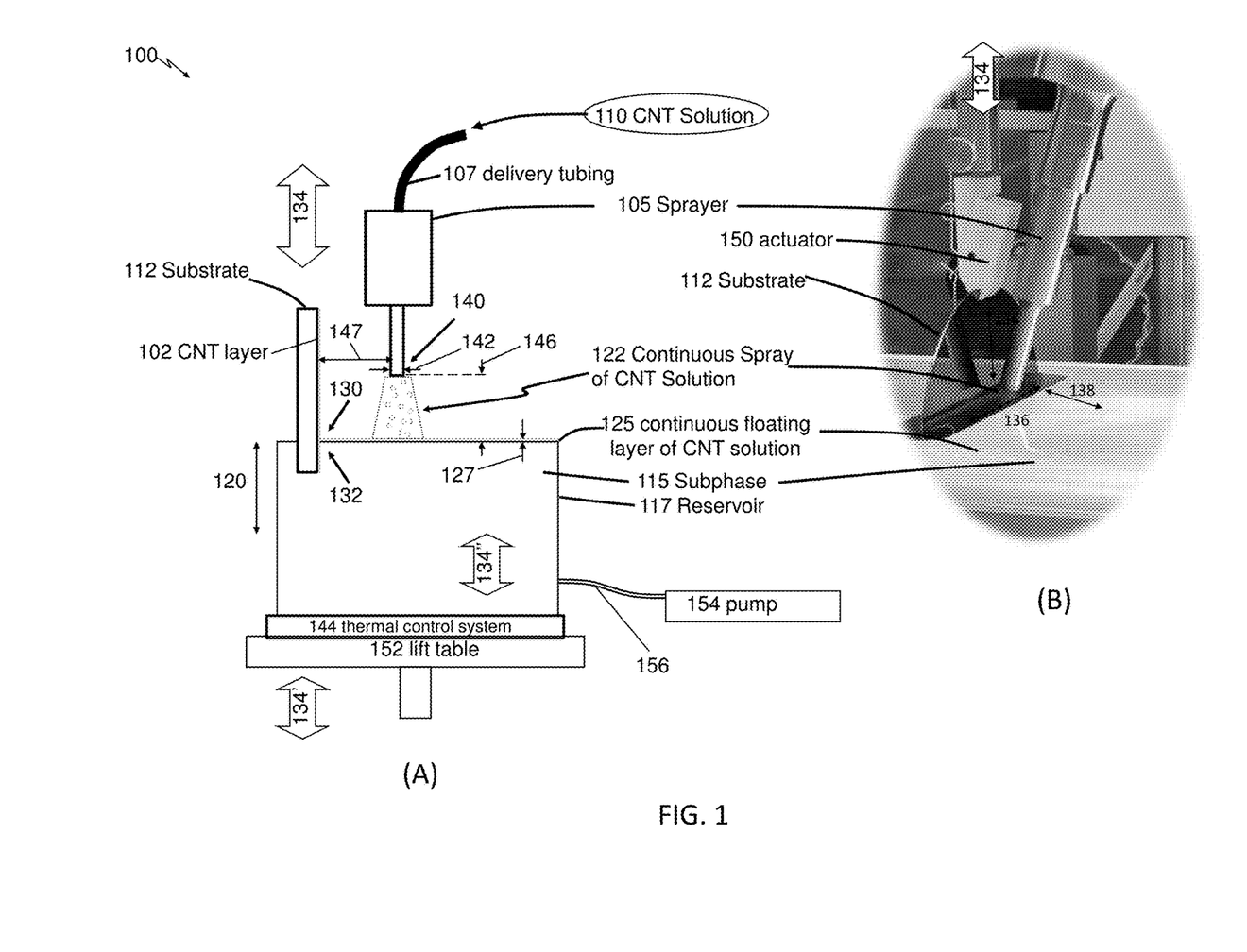
FIG. 1 shows: (A) a schematic diagram and (B) a photo of embodiments of a system of the disclosure used to deposit a layer of aligned carbon nanotubes (CNT) on a substrate.

An example system embodiment 100 for producing a layer of aligned carbon nanotubes (e.g., layer 102) is shown in FIGS. 1A and 1B. The system 100 includes a sprayer 105 (e.g., an ultrasonic sprayer or electro-sprayer). A delivery tube 107 delivers a solution 110 containing CNTs to the sprayer. A substrate 112 on which aligned CNTs are to be deposited can be at least partially, and in some embodiments, fully, submerged in a subphase 115.

The term subphase, as used herein, refers to a body of liquid, contained within a reservoir, such that the top of the subphase is a free surface, e.g., the surface at an air/liquid interface. The subphase free surface is where the CNT solution will spread. The subphase can be any liquid including water, oil, or solvent that allows spreading of the CNT solution. Some embodiments of the subphase liquid are immiscible with the solvent in the CNT solution.

As illustrated in FIG. 1A, the subphase 115 can be partially or fully contained in a reservoir 117. A depth 120 of the reservoir is sufficient to allow the substrate to be completely submerged into the subphase. The sprayer 105 can generate a continuous spray (e.g., a spray cone 122) of the CNT solution having droplets with a median droplet diameter in a range from about 1 to about 100 microns, corresponding to median droplet volumes in a range from about $5.2 \times 10^{-10}$ to $5.2 \times 10^{-4}$ microliters.

This is in contrast to the DCFEA method which uses needles to form drops have diameters of approximately 1000 microns and corresponding volumes of approximately 1 microliter. For the same CNT solution volume delivery rate, the continuous spray delivered using the system 100 of the disclosure can range from about 1000 to 1 billion droplets, in about the same time that 1 drop is delivered in the DCFEA method. The small size and rapid arrival rate of microsprayed droplets onto the subphase make the spray, effectively, continuous.

The continuous spray of CNT solution 122 spreads and forms a continuous floating layer 125 supported by the subphase 115 contained in the reservoir 117. We believe that the generation of the continuous floating layer 125 via the continuous spray 122 helps to minimize disrupting the subphase 115 and facilitate maintaining a constant thickness 127 of the continuous floating layer 125 on the subphase 115 while forming a CNT layer, as compared to dropping much larger discrete droplets of CNT solution onto the subphase, e.g., via the DCFEA method.

The sprayer is positioned sufficiently close to the subphase and the substrate so that the floating layer of CNT solution contacts the substrate, forming two interfaces: an air/CNT solution/substrate interface 130 and a CNT solution/subphase/substrate interface 132. We have discovered that moving a substrate through such interfaces 130, 132 (e.g., in direction 134) can facilitate forming a layer of aligned CNTs on the substrate.

The positioning of the sprayer nozzle outlet 140 relative to the subphase and the substrate are important determinants effecting the deposition of well-aligned CNTs on the substrate. As illustrated in FIG. 1A, in some embodiments, the outlet 140 of the sprayer 105 is positioned a distance 146 from the subphase 115 in a range from about 1 to about 50 mm. As the sprayer is positioned closer to the subphase (e.g., a distance 146 of less than 1 mm, in some embodiments) then there is an increased risk that the spray 122 from the spryer can interfere with the subphase. As the sprayer is positioned farther away from the subphase (e.g., a distance 146 of greater than 50 mm, in some embodiments) then there is a greater risk that portions of the continuous spray 122 can directly contact the substrate 112 (e.g., without first contacting the subphase) resulting in the deposition or randomly oriented CNTs on the substrate.

As illustrated in FIG. 1A, in some embodiments, the outlet 140 of the sprayer 105 is positioned a distance 147 from the substrate 112 in a range from about 1 to about 20 mm. As the sprayer is positioned farther away from the substrate (e.g., a distance 147 of greater than 20 mm, in some embodiments) then the deposition of CNTs can decrease because the floating CNT layer 125 become discontinuous, e.g., because the CNT solution does not spread out far enough on the subphase 115 to reach the substrate 112, e.g., before evaporating or losing continuity. As the sprayer is positioned closer to the substrate (e.g., a distance 147 of less than 1 mm, in some embodiments) then there is a greater risk that portions of the continuous spray 122 can directly contact the substrate 112 (e.g., without first contacting the subphase) resulting in the deposition of randomly oriented CNTs on the substrate.

The thickness 127 of the continuous floating layer of CNT solution contacting the substrate is continuously maintained to be greater than zero, and preferably in a range conducive to depositing aligned CNTs. In some embodiments, the thickness 127 has a value in a range from about 0.01 to about 1 mm. In some embodiments, if the continuous floating layer 125 has a thickness 127 of less than 0.01 microns then the continuity of the floating layer can be rapidly lost, e.g., due to evaporation of the solvent (e.g., chloroform) of the CNT solution or spreading of the CNT solution out over the substrate, resulting the deposited CNT not being aligned as desired. In some other embodiments, if the continuous floating layer 125 has a thickness 127 of greater than 1 mm then the CNT solution can pool up, e.g. to form blotches of the solution on the subphase resulting in a non-uniform deposition of the CNTs on the substrate.

The continuous floating layer is maintained by delivering a suitable rate of CNT solution from the sprayer to the subphase. The rate at which the sprayer generates the continuous spray depends on the rate at which the substrate is removed from the subphase and the area of the substrate. The rate at which the sprayer dispenses the spray of CNT solution is adjusted to match the rate at which the CNT being inserted or removed from the subphase so that a continuous floating layer of CNT remains on the subphase. For example in some embodiments, the rate of CNT solution delivery from the sprayer to the subphase range can be a value in a range from about 10 to about 1000 microliters per minute.

Figure 2:
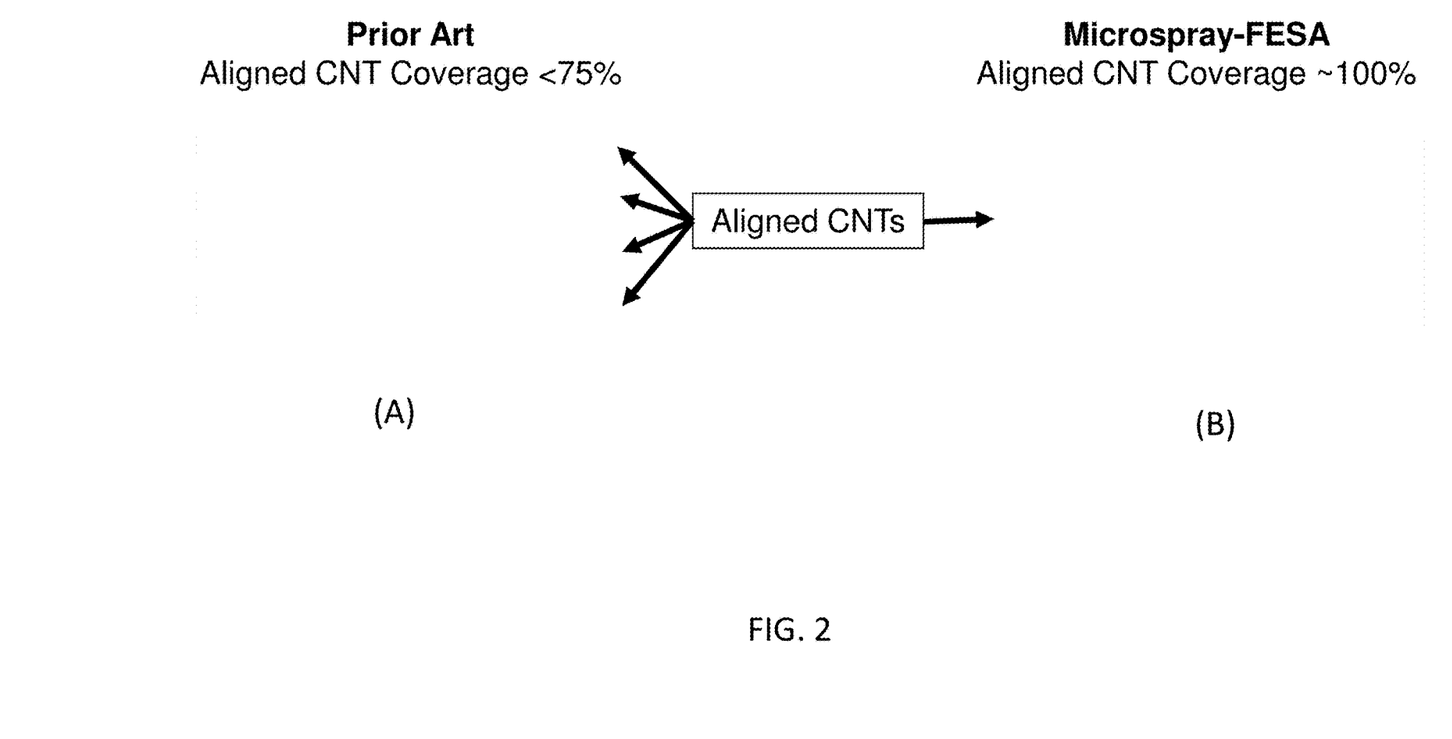
FIG. 2 compares layers of deposited CNT layers formed using: (A) a conventional (prior art) method and (B) using a Microspray-floating evaporative self-assembly (FESA) method embodiment of the disclosure.

In some embodiments, the system 100 includes an actuator 150 configured to move the substrate 112 to insert or remove the substrate 112 into or from the subphase 115, respectively, as the sprayer 105 maintains a continuous floating layer of the carbon nanotube solution 125 on the subphase 115. For instance, the actuator 150 can extract or insert the substrate 112 out of or into the subphase 115 contained in the reservoir 117 as the sprayer 105 maintains the continuous floating layer 125. In some embodiment the extraction or insertion rate of the substrate can be a value in a range from about 1 to about 100 millimeters per minute. As the substrate is lifted out from the subphase (or inserted into the subphase), the substrate passes through the continuous floating layer of CNT solution. Aligned CNTs are deposited on the substrate 112 as a layer 102 in the region where the continuous floating layer contacts 125 the substrate 112. In one interpretation, aligned CNTs deposit on the substrate at the CNT solution/subphase/substrate interface 132. Maintaining the continuous floating layer on the subphase enables continuous deposition of aligned CNTs on the substrate, without the periodic stripes characteristic of DCFEA, as depicted in FIG. 2. The CNT solution can include CNTs dispersed in water or an organic solvent, including toluene, chloroform, 1,2-dichloroethane, tetrahydrofuran, etc.

In other embodiments, the system 100 includes a lift table 152 supporting the reservoir 117, the table 152 configured to move the reservoir 117 (e.g., along direction 134' at a rate in a range from about 1 to about 100 millimeters per minute in some embodiments) to insert or remove the substrate 112 into or from the subphase 115, respectively, as the sprayer 105 maintains a continuous floating layer 125 of the carbon nanotube solution on the subphase 115.

In still other embodiments, the system 100 includes a pump 154 fluidly connected to the reservoir 117 (e.g., via tubing 156), the pump configured to add or remove the subphase 115 from the reservoir 117 (e.g., along direction 134" at a rate in a range from about 1 to about 100 millimeters per minute) to insert or remove the substrate 120 into or from the subphase 115, respectively, as the sprayer 105 maintains a continuous floating layer 125 of the carbon nanotube solution on the subphase 115.

Embodiments of the system 100 can include one or more of the actuator 150, lift table 152 or pump 154, and, these components can be used in combination, or separately, to insert or remove the substrate into or from the subphase.

The ease of scaling the system, or the deposition method, by adding more sprayers (e.g., atomizers or electro-sprayers), to maintain the continuous floating layer 125, can allow the deposition of the CNT layer to be readily increased for larger area substrates. For example, in some embodiments of the system 100, instead of using a single sprayer dispensing nozzle, the sprayer can include a plurality of microspray dispensing nozzles configured and arranged to increase an area of the floating layer on the subphase. For example, an arbitrary number (N) of microspray dispensing nozzles can be arranged in parallel (e.g., a 1×N array of sprayers) to cover the entire span of the substrate.

We believe that embodiments of the system 100 with multiple sprayers 105 would be easier to implement to form a layer of aligned CNTs as compared to, e.g., a system implementing the DCFEA method using multiple needles to disperse a CNT solution drop-by-drop onto the subphase. In the later, as a drop falls on the subphase, the subphase can be disrupted, e.g., as demonstrated by forming waves on the subphase. Each successive drop could form more complex disruptions, e.g., as a result of constructive or destructive interference between waves formed on the subphase. In contrast, the continuous spray 122 of micron-sized drops of the CNT solution from multiple sprayers 105 of the system 100 are not expected to interact with the subphase to form such wave interference patterns on the subphase.

A direction of relative motion between the sprayer and the substrate (e.g., wafer) is indicated as direction 134, 134', 134" in FIGS. 1A and 1B. In some embodiments a plurality of the sprayer nozzles 140 can be arranged in parallel along line 136, which is a line perpendicular to direction 134. In embodiments having a plurality of sprayers 105, the sprayer nozzles 140 may be offset from each other, for example, along direction 138 in FIG. 1B. An exemplary range for the size of the dispensing nozzle outlet 140 is an opening diameter 142 in a range from about 1 to about 100 microns and in some embodiments, in a range of about 2 to about 20 mm. In some embodiments multiple sprayer nozzles can be packed together as closely as 1 mm apart.

Using the methods and systems disclosed herein, a continuous spray of CNT solution is generated to facilitate forming the continuous alignment of CNTs on the substrate, without forming stripes of misaligned or low density CNTs. The aligned CNTs can be deposited over a large area (e.g., a 100 mm diameter wafer), and not be limited to small widths (e.g., 30 mm or lesser widths) near a dispensing needle such as used in the DCFEA method. In other words, the methods and systems disclosed herein are readily scalable. The sprayers can be or include ultrasonic atomizers that can generate micron-sized droplets of the CNT solution. Alternatively, sprayers can be or include an electrospray. Such an electrospray can be used by applying an electric potential across a metal nozzle and the target of the fluid. In some such embodiments, small drops of the fluid are accelerated off of the nozzle and at the target due to the electric potential. In addition, compressed air in which the CNT solution can be mixed with air at high pressures and released from a nozzle to facilitate forming an aerosol of the CNT solution.

As illustrated in FIG. 1A, in some embodiments, the subphase 115 contained in the reservoir 117 can also be thermally controlled (e.g., via a thermal control system 144) to maintain the subphase within certain temperature ranges, e.g., heated to a constant temperature, e.g., ±1° C., higher than room temperature, to aid in the evaporation of the solvent from the CNT solution after deposition on the substrate, or cooled to a constant temperature e.g., ±1° C., lower than room temperature, to deter the evaporation of the solvent from the CNT solution after deposition on the substrate.

Embodiments of the sprayer can be configured to provide a floating layer having a thickness 127 in a range from about 0.01 to about 1 mm, and an area in a range from about 500 mm$^2$ to about 71,000 mm$^2$.

Using the methods and systems disclosed herein, full substrate (e.g., wafer) coverage of the deposited aligned CNT can be achieved. In this way, no area on the substrate is wasted by not being covered by the CNTs. In addition, the method is amenable for use with substrates that can be rolled after the CNT is deposited (e.g. plastics, metal foils, etc. . . . ), for example, like in newspaper printing. The methods and systems disclosed herein are also compatible with CMOS processes in the semiconductor industry. The dosage of the CNT solution can be controlled, for example, by either controlling a concentration of the CNT solution, or by controlling the rate at which droplets are generated and sprayed from the sprayer. In some embodiments, of the CNT solution, CNT concentration can be a value in a range from about 1 to about 100 micrograms of CNTs per milliliter of solution. In some embodiments, the delivery rate of CNT solution from a single sprayer can be a value in a range from about 10 to about 1000 microliters per minute.

The deposited, aligned CNTs, formed using any embodiments of the system and method disclosed herein, can be used as the active material in field effect transistors (FET), as interconnects, as sensors (e.g., bio- or chemical sensor), as flexible electronic circuits, as transparent conductors, as anisotropic electric conductors, or used in high performance mechanical and thermal applications.

Figure 3:
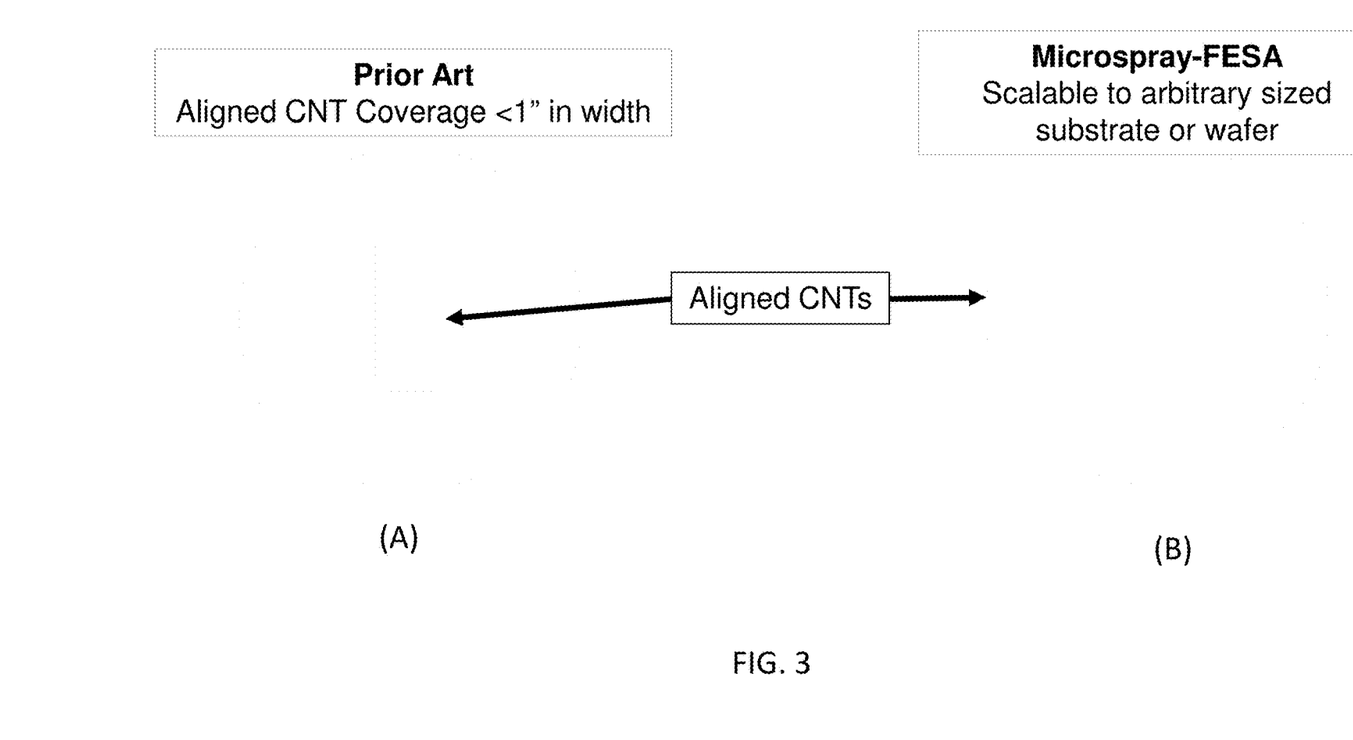
FIG. 3 compares a size of deposited CNT formed using: (A) a conventional (prior art) method and (B) using a method embodiment of the disclosure.

FIG. 2 compares the results of using the DCFEA method vs. the methods disclosed herein. As shown, the present methods allow for uniform, high density, aligned CNT to be deposited across substantially all of the substrate/wafer. FIG. 3 also compares the size of the deposited area that can be achieved using the DCFEA methods vs. the method disclosed herein. As shown, the present method can be readily scaled up to cover substantially all of the substrate/wafer.

Figure 9:
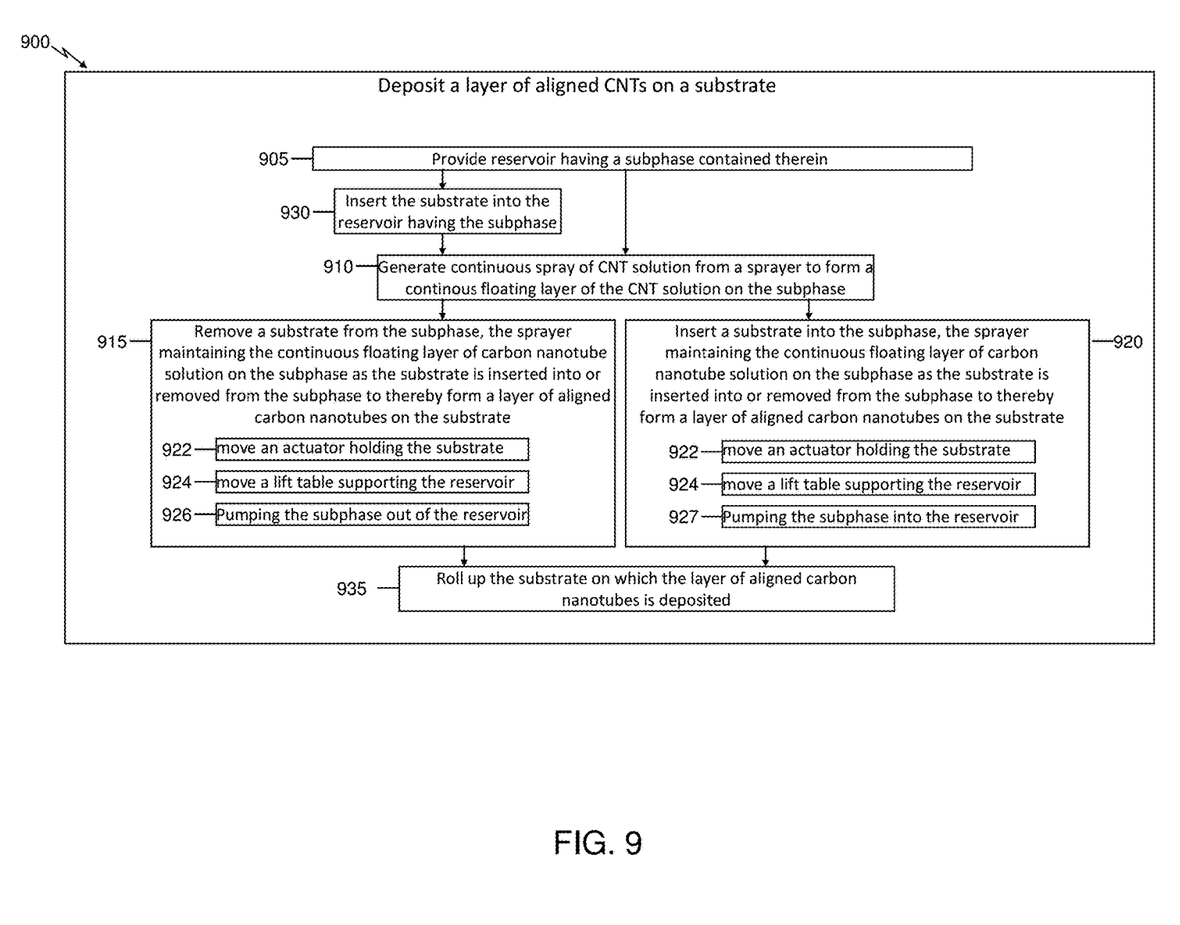
FIG. 9 presents a flow diagram of an embodiment of a method of depositing a layer of aligned carbon nanotubes on a substrate in accordance with the disclosure.

FIG. 9 presents a flow diagram of an embodiment of a method 900 of depositing a layer of aligned carbon nanotubes on a substrate in accordance with the disclosure. Any of the system embodiments and procedures disclosed herein can be used to implement the method 900.

Embodiments of the method 900 can comprise providing (step 905) a reservoir having a subphase contained therein. Embodiments of the method 900 can also comprise generating a continuous spray of a carbon nanotube solution (step 910) from a sprayer to form a continuous floating layer of the carbon nanotube solution supported on the subphase. The spray of the carbon nanotube solution includes droplets, the droplets having a median diameter in a range from about to about 100 microns. The method 900 also can comprise removing (step 915) a substrate from the subphase, or, inserting (step 920) a substrate into the subphase, the continuous layer of the carbon nanotube solution being in contact with the substrate. The sprayer (e.g., as part of step 910 and during steps 915 or 920) maintains the continuous floating layer of the carbon nanotube solution on the subphase as the substrate is inserted (step 915) into or removed (step 120), respectively, from the subphase to thereby form a layer of aligned carbon nanotubes on the substrate.

In some embodiments, removing or inserting the substrate from or into the subphase can include (e.g., as part of steps 915 or 920) moving an actuator (step 922) holding the substrate so that the substrate is inserted into or removed from the subphase, respectively, as the sprayer maintains a continuous floating.

In some embodiments, removing or inserting the substrate from or into the subphase can include (e.g., as part of steps 915 or 920) includes moving a lift table supporting the reservoir (step 924) so that the substrate is inserted into or removed from the subphase, respectively, as the sprayer maintains continuous floating layer of the carbon nanotube solution on the subphase.

In some embodiments, removing or inserting the substrate from or into the subphase can include (e.g., as part of steps 915 or 920) pumping the subphase out of or into the reservoir (steps 926 927, respectively), via a pump fluidly connected to the reservoir, so that the substrate is inserted into or removed from the subphase, respectively, as the sprayer maintains a continuous floating layer of the carbon nanotube solution on the subphase In some embodiments, generating the continuous spray of the carbon nanotube solution includes (as part of step 910) spraying from a sprayer configured as an ultrasonic atomizer. In some embodiments, generating the continuous spray of the carbon nanotube solution includes (as part of step 910) spraying from a sprayer configured as an electro-sprayer. In some embodiments, generating the continuous spray of the carbon nanotube solution includes part of step 910) passing the carbon nanotube solution through a nozzle along with high pressure compressed air to form an aerosol of the carbon nanotube solution.

In any such embodiments, generating the continuous spray of the carbon nanotube solution includes (as part of step 910) in contact with the substrate by varying the rate at which the sprayer sprays the carbon nanotube solution or by varying a concentration of the carbon nanotube solution.

In some such embodiments, the deposited layer of aligned carbon nanotubes covers an area of the substrate in a range from about 90 percent to about 100 percent of a total area of the substrate.

Embodiments of the method 900 that include the step 915 of removing the substrate from the subphase having the floating layer of the carbon nanotube solution on the subphase can further include inserting the substrate into the reservoir having the subphase (step 930) prior to the step 910 of forming the floating layer of the carbon nanotube solution on the subphase.

Some embodiments of the method 900 can optionally further include rolling up the substrate (e.g., step 935) on which the layer of aligned carbon nanotubes is deposited.

Figure 10:
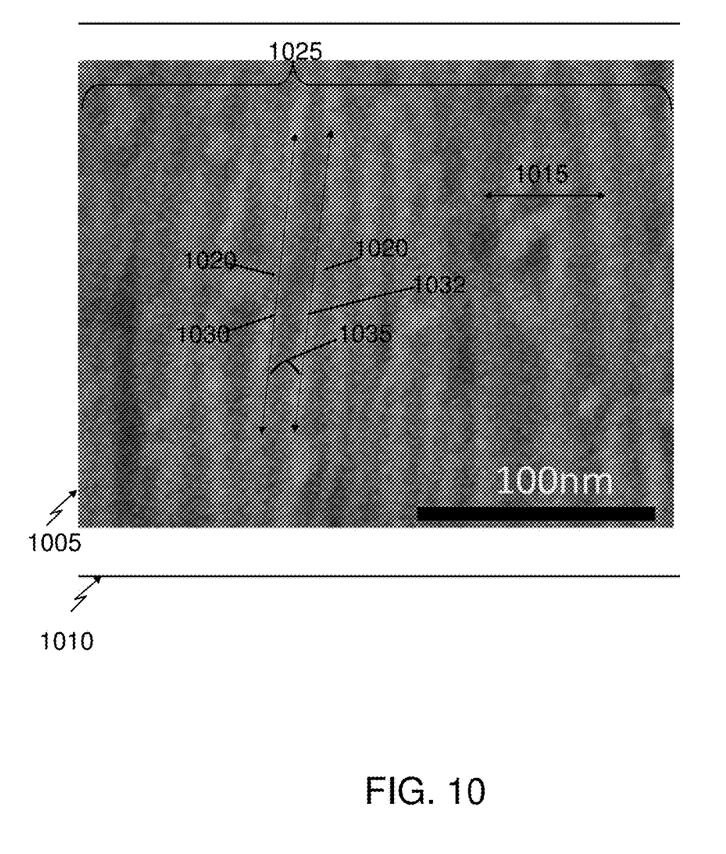
FIG. 10 shows an image of CNTs formed using method and system embodiments of the disclosure.

Another embodiment is a substrate having a layer of aligned carbon nanotubes deposited using any of the method and system embodiments of the disclosure. As illustrated in FIG. 10, in some such embodiments, a density of the carbon nanotubes 1005 on the substrate 1010 is in a range from about 5 to about 300 nanotubes per micron of a lateral length 1015 perpendicular to a long axis 1020 of the aligned carbon nanotubes on the substrate. As also illustrated in FIG. 10, in some such embodiments, a width 1025 of the layer of aligned carbon nanotubes 1005 is in a range from about 10 to about 300 mm. As further illustrated in FIG. 10, in some such embodiments, the long axis 1020 of each of the carbon nanotubes (e.g., tubes 1030 and 1032) are aligned within an angle (e.g., angle 1035) of about ±20° of adjacent ones of the carbon nanotubes.

While this specification contains many implementation details, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. For example, it should be understood that terms of positioning and orientation (e.g., top, vertical) have been used to describe the relative positioning and orientation of components, but the components can be held in various positions or orientation (e.g., a vertical or horizontal orientation or some other orientation). Moreover, the separation of various system components in the embodiments described above should not be understood as requiring such separation in all embodiments.

Thus, particular embodiments of the invention have been described. Other embodiments are within the scope of the following claims. For example, the actions recited in the claims can be performed in a different order and still achieve desirable results.

The invention claimed is:

1. A method of depositing a layer of aligned carbon nanotubes on a substrate, the method comprising:
    providing a reservoir having a water subphase contained therein;
    generating a continuous spray of a carbon nanotube solution from a sprayer to form a continuous floating layer of the carbon nanotube solution supported on the subphase, wherein the carbon nanotube solution includes carbon nanotubes dispersed in chloroform and the spray of the carbon nanotube solution includes droplets, the droplets having a median diameter in a range from about 1 to about 100 microns; and removing or inserting a substrate from or into, respectively, the subphase, the continuous floating layer of the carbon nanotube solution being in contact with the substrate, the sprayer maintaining the continuous floating layer of carbon nanotube solution on the subphase as the substrate is inserted into or removed from the subphase to thereby form a layer of aligned carbon nanotubes on the substrate.

2. The method of claim 1, wherein removing or inserting the substrate from or into the subphase includes moving an actuator holding the substrate so that the substrate is inserted into or removed from the subphase, respectively, as the sprayer maintains a continuous floating layer of the carbon nanotube solution on the subphase.

3. The method of claim 1, wherein removing or inserting the substrate from or into the subphase includes moving a lift table supporting the reservoir so that the substrate is inserted into or removed from the subphase, respectively, as the sprayer maintains a continuous floating layer of the carbon nanotube solution on the subphase.

4. The method of claim 1, wherein removing or inserting the substrate from or into the subphase includes pumping the subphase into or out of the reservoir, via a pump fluidly connected to the reservoir, so that the substrate is inserted into or removed from the subphase, respectively, as the sprayer maintains a continuous floating layer of the carbon nanotube solution on the subphase.

5. The method of claim 1, wherein generating the continuous spray of the carbon nanotube solution includes spraying from a sprayer configured as an ultrasonic atomizer.

6. The method of claim 1, wherein generating the continuous spray of the carbon nanotube solution includes spraying from a sprayer configured as an electro-sprayer.

7. The method of claim 1, wherein generating the continuous spray of a carbon nanotube solution includes passing the carbon nanotube solution through a nozzle along with high pressure compressed air to form an aerosol of the carbon nanotube solution.

8. The method of claim 1, generating the continuous spray of the carbon nanotube solution includes controlling a dose of the carbon nanotubes in contact with the substrate by varying the rate at which the sprayer sprays the carbon nanotube solution or by varying a concentration of the carbon nanotube solution.

9. The method of claim 1, further including rolling up the substrate on which the layer of aligned carbon nanotubes is deposited.

10. The method of claim 1, wherein the layer of aligned carbon nanotubes covers an area of the substrate in a range from about 90 percent to about 100 percent of a total area of the substrate.

11. The method of claim 1, wherein the sprayer is positioned a distance from substrate in a range of about 1 mm about 20 mm.

12. The method of claim 1, wherein the continuous floating layer of carbon nanotube solution on the subphase has a thickness in a range from about 0.01 to about 1 mm.

* * * * *